United States Patent
Madeyski et al.

(10) Patent No.: US 6,175,418 B1
(45) Date of Patent: Jan. 16, 2001

(54) MULTIPLE ALIGNMENT MECHANISM IN CLOSE PROXIMITY TO A SHARED PROCESSING DEVICE

(75) Inventors: Kris Madeyski, Sunnyvale; John Horn, Los Gatos, both of CA (US)

(73) Assignee: Intergen, Inc., Sunnyvale, CA (US)

( * ) Notice: Under 35 U.S.C. 154(b), the term of this patent shall be extended for 0 days.

(21) Appl. No.: 09/237,978

(22) Filed: Jan. 25, 1999

(51) Int. Cl.$^7$ .................................................. G01B 11/00
(52) U.S. Cl. .............................. 356/399; 414/936
(58) Field of Search ................... 356/399–401; 414/936

(56) References Cited

U.S. PATENT DOCUMENTS

| | | | |
|---|---|---|---|
| 4,466,073 | * 8/1984 | Boyan et al. | 364/559 |
| 4,836,733 | * 6/1989 | Hertel et al. | 414/225 |
| 5,329,090 | * 7/1994 | Woelki et al. | 219/121.68 |
| 5,486,080 | * 1/1996 | Sieradzki | 414/217 |
| 5,956,148 | * 9/1999 | Celii | 356/369 |
| 5,978,081 | * 11/1999 | Michael et al. | 356/243.1 |

FOREIGN PATENT DOCUMENTS

| | | |
|---|---|---|
| 62-127191 | 6/1987 | (JP) . |
| 63-213356 | 9/1988 | (JP) . |
| 64-30242 | 2/1989 | (JP) . |

* cited by examiner

Primary Examiner—Frank G. Font
Assistant Examiner—Phil Natividad
(74) Attorney, Agent, or Firm—Burns Doane Swecker & Mathis L.L.P.

(57) ABSTRACT

An alignment system includes two or more alignment devices arranged in close proximity and sharing a common processing device. The alignment devices are located adjacent to one another, yet while one substrate is being processed, a second substrate can be prepared for processing without affecting or interfering with the first substrate, thereby resulting in greater utilization of the process resource.

6 Claims, 5 Drawing Sheets

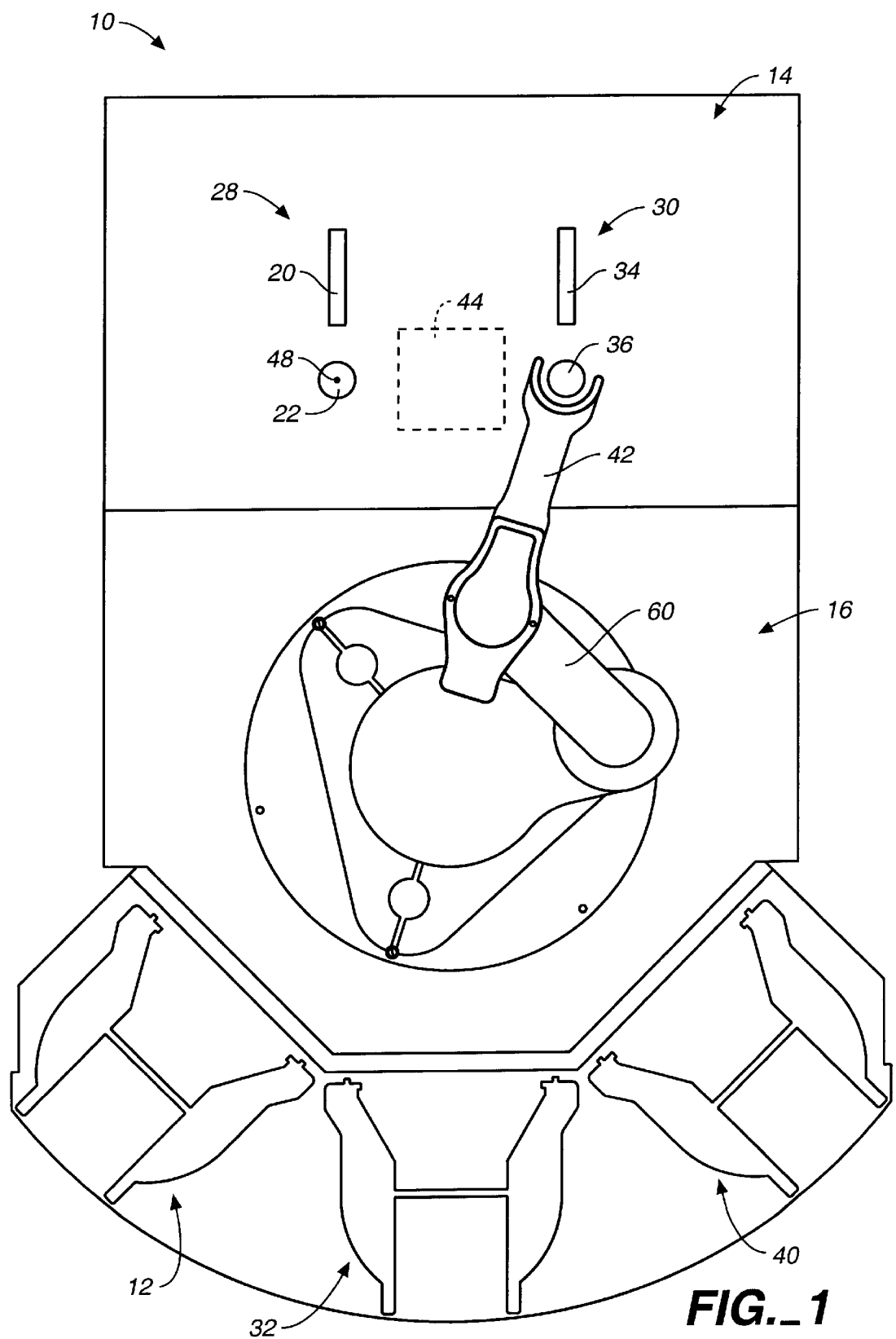
FIG._1

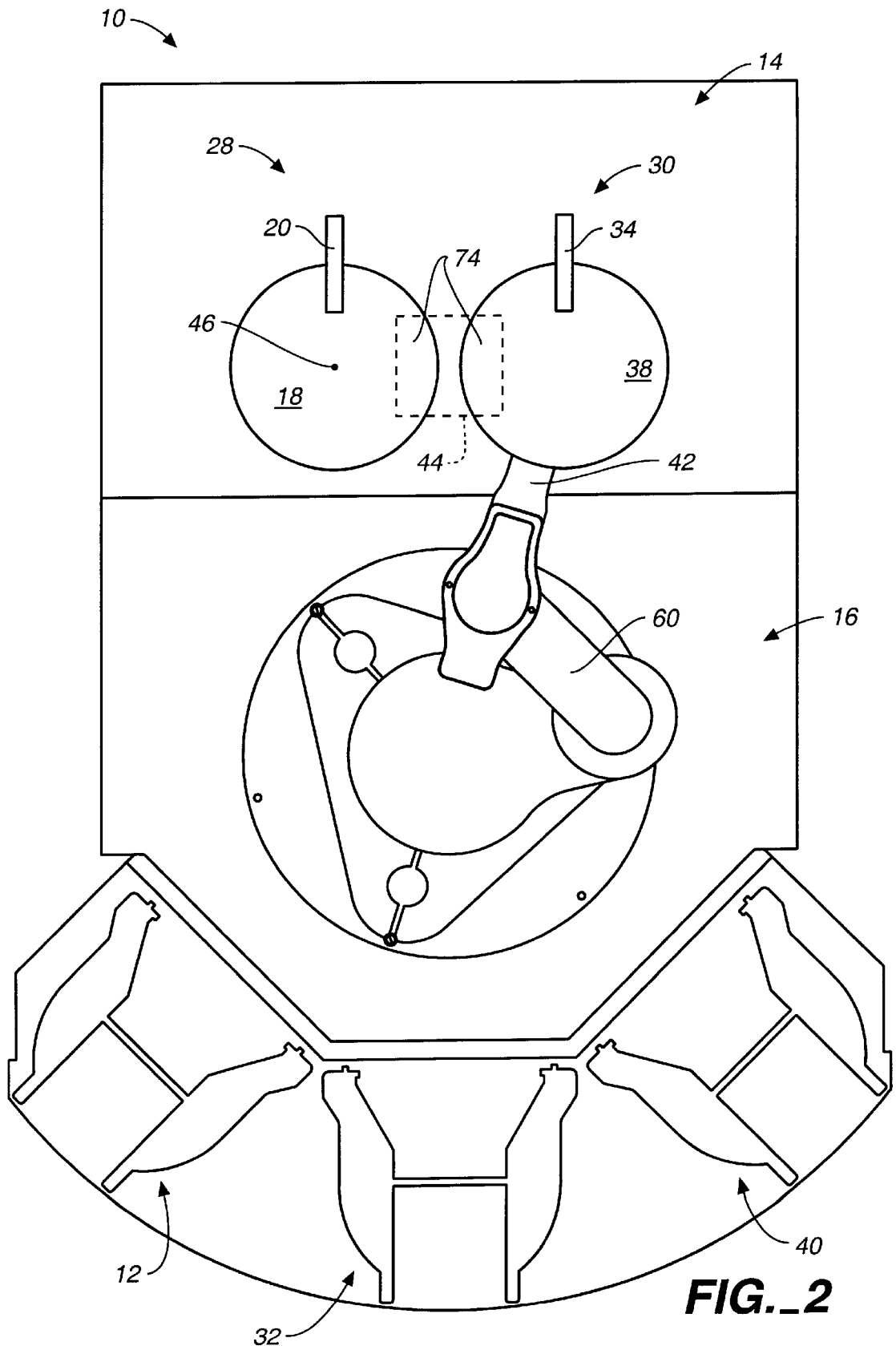
FIG._2

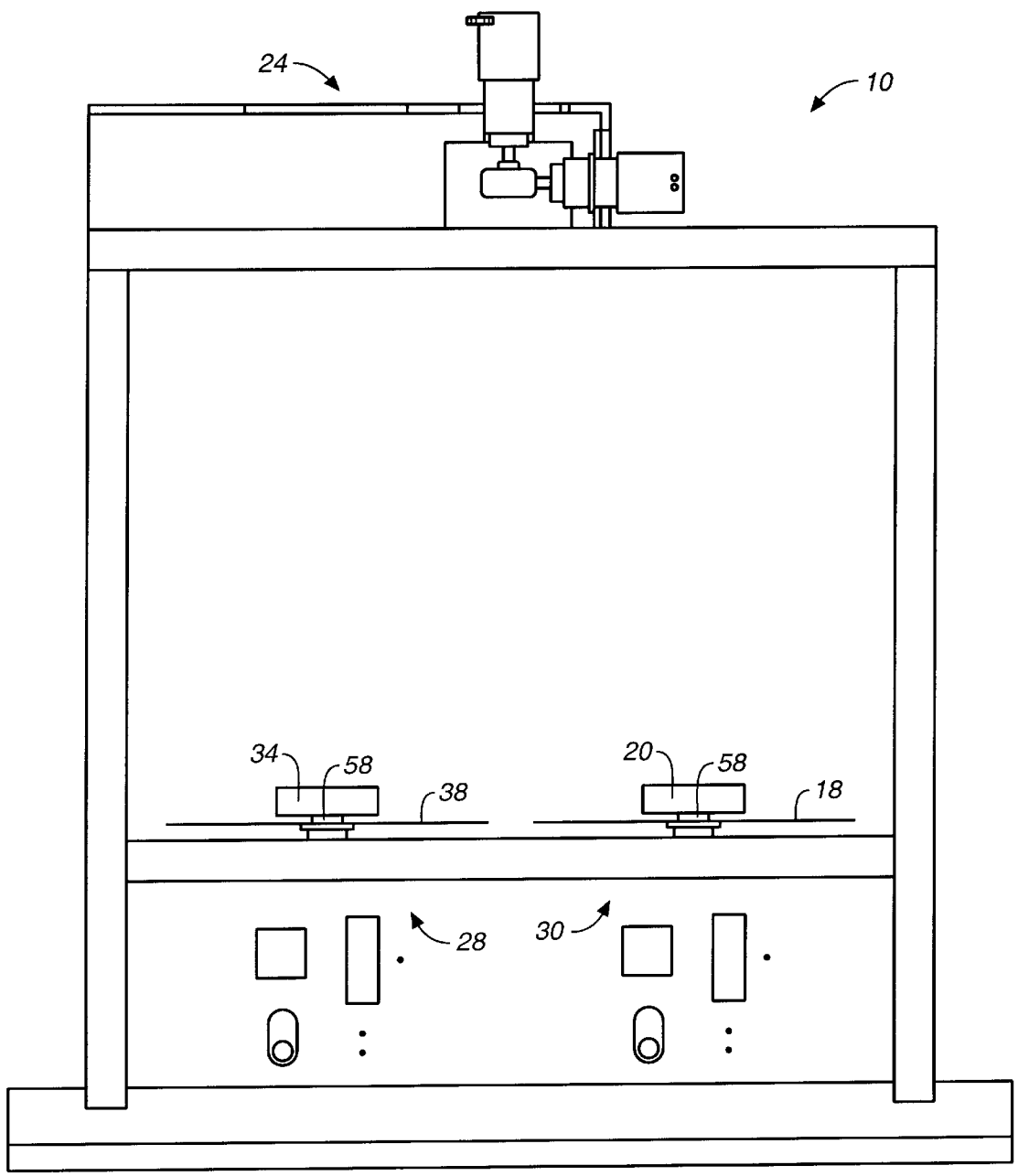
FIG._3

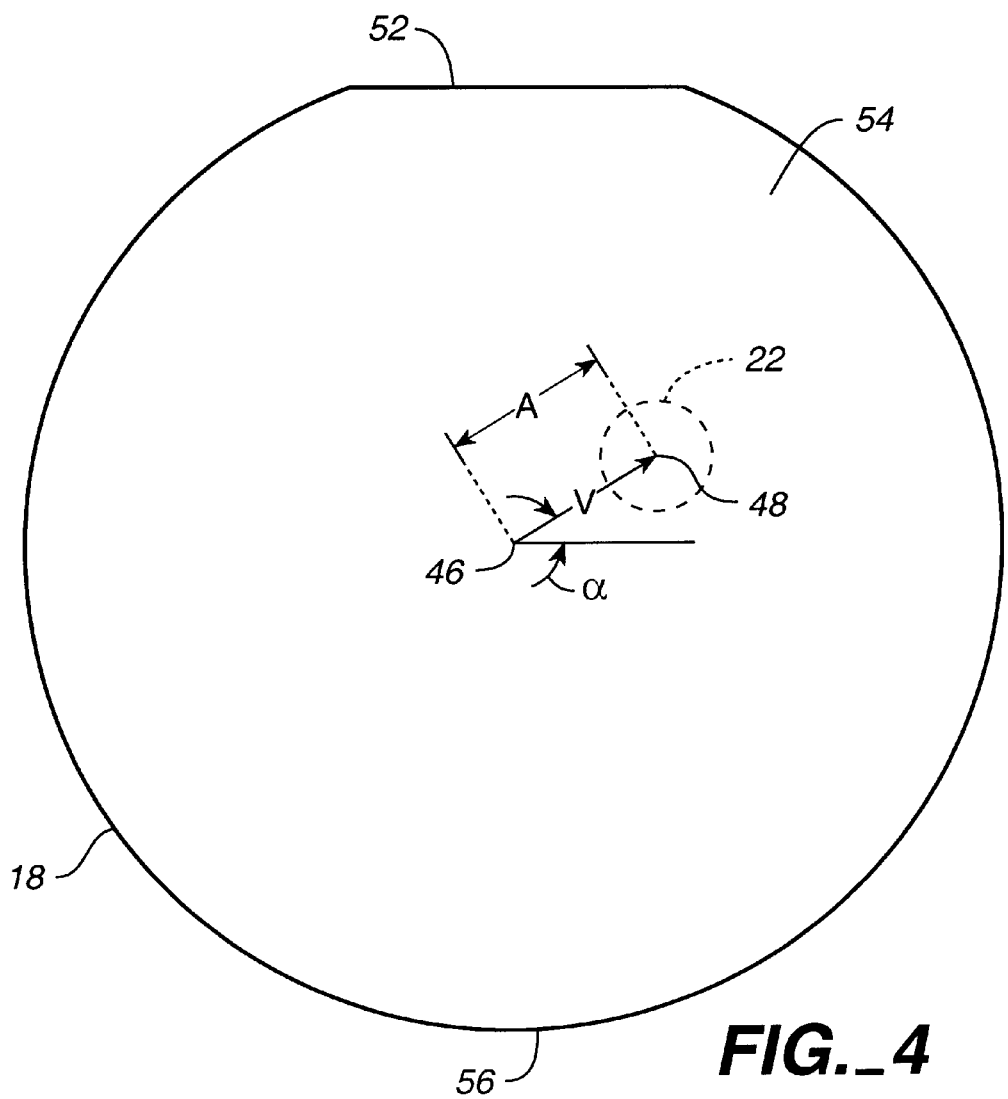
FIG._4

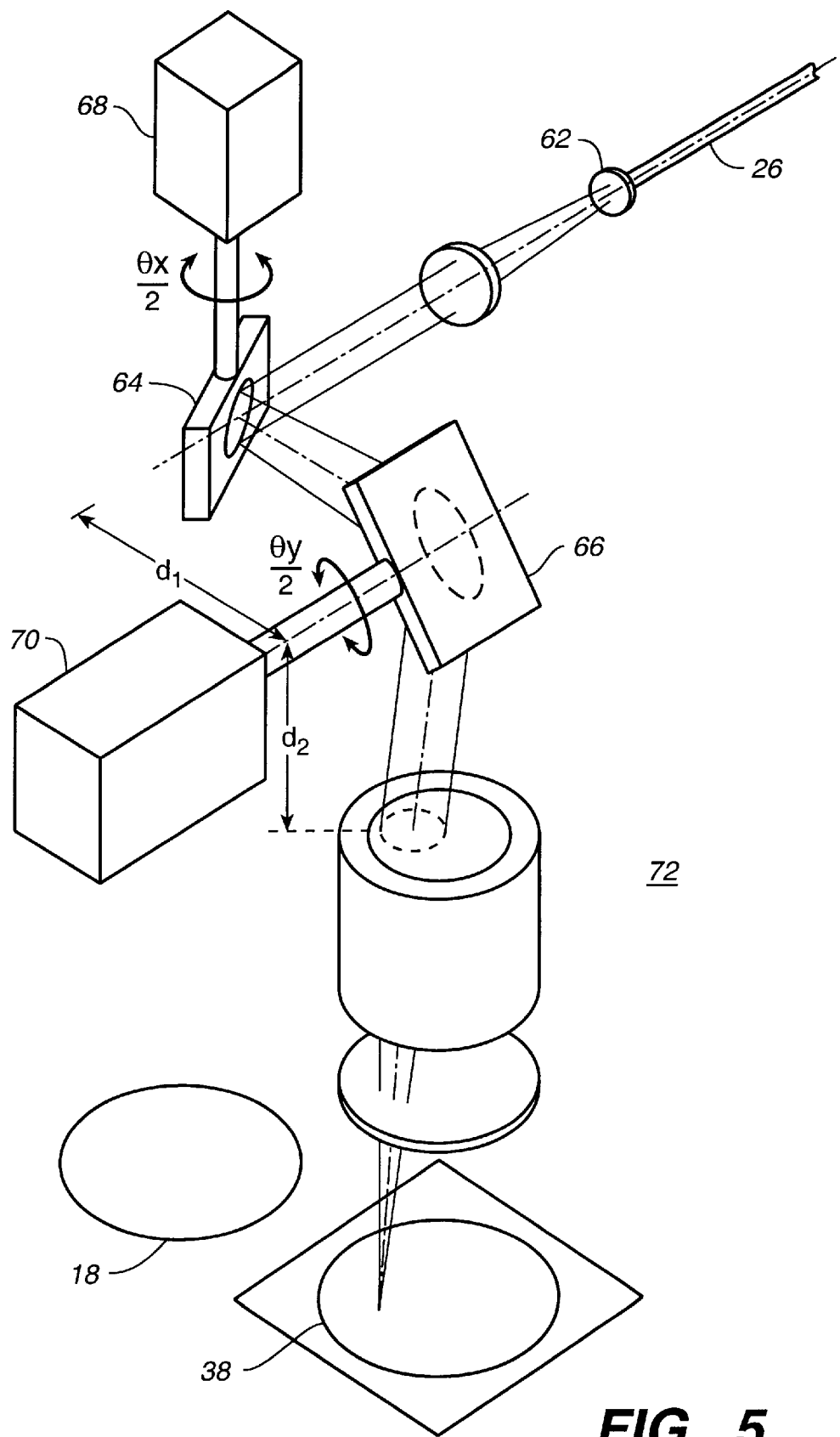
FIG._5

MULTIPLE ALIGNMENT MECHANISM IN CLOSE PROXIMITY TO A SHARED PROCESSING DEVICE

BACKGROUND OF THE INVENTION

1. Field of the Invention

The present invention is related to alignment systems for inspecting or processing substrates used for production in the semiconductor industry. In particular, the invention relates to alignment systems for use with vision inspection systems or laser scribing systems and the like.

2. Brief Description of the Related Art

Robot manipulated substrates used for production in the semiconductor industry, including semiconductor wafers, flat panels, reticles, and the like, usually require accurate orientation and placement relative to a mark or indicator before a processing step can be applied. The steps of identifying initial substrate orientation and placement before aligning the substrate to a known position, called "profiling," consume a significant portion of the total substrate process time budget and impact the throughput of substrate material in the system. Typically during the substrate handling or aligning steps, the processing station remains inactive which equates to smaller yields and wasted resources.

To minimize the processing station idle time, robot-based substrate handlers traditionally utilize multiple end effector transport mechanisms and prealignment stations that mechanically center and profile substrate orientation marks for use in subsequent processing steps. Prealigning is a process of orienting and centering a substrate on the robot end effector so that an orientation mark, such as a flat or notch on the substrate surface, is set at a predefined angle and the substrate center is positioned at a predefined location on the end effector. Prealigning ensures that successively processed substrates are all oriented with the mark in the same direction and centered during the process. Prealigner-equipped systems typically use a robotic substrate handler which prealigns the end effector with respect to the substrate material, picks up the substrate material from a sourcing device, and then delivers the substrates to a process module for processing.

Processing a substrate exemplarily involves using a scribing system to mark the substrate surface in a desired location based upon the substrate profiling information. The substrates introduced into a process module are oriented and placed relative to the orientation and placement restrictions imposed by the equipment. The robotic substrate handler then moves to another sourcing device to retrieve a second substrate.

If the first substrate is improperly placed or misaligned, the design of these alignment systems requires the robotic substrate handler to traverse the processing station to recover the misplaced or misaligned substrate and attempt to correct the substrate's orientation or position problem in the process module. The robotic substrate handler will then re-traverse the processing station and return to the second substrate, still waiting in its sourcing device. This realignment process repeats until the first substrate is properly oriented and positioned in the process module. These physical alignment and orientation corrections may require significant time to complete and accordingly decrease the system throughput of substrate material.

Accordingly, it would be desirable to provide a multi-chamber, shared resource substrate processing system, whereby while one processing station performs the necessary orientation and placement for substrate profiling, a second processing station can prepare a second substrate for alignment and substrate profiling.

SUMMARY OF THE INVENTION

The present invention relates to dual alignment mechanisms in close proximity to a shared processing device and the method of use thereof. Substrate alignment devices and related technology improve system throughput for substrate processing equipment, and particularly for substrate scribing equipment.

In accordance with one aspect of the present invention, there is provided an alignment system having at least two alignment devices in close proximity to one processing device (e.g., a marking device) such that two substrates can extend into the processing area of the processing device. The processing device is able to process one substrate without affecting or interfering with another substrate being prepared for processing. The alignment devices rotate but do not lift to reorient the substrate, thus eliminating mechanical reorientation of the substrate by the robot. The present invention utilizes information collected by a sensing system of the alignment devices to adjust the laser beam during the marking of the substrate surface.

In accordance with an additional aspect of the present invention, the method for processing a substrate using the substrate processing system includes the steps of transporting a substrate to an alignment device for processing and then sensing the orientation and position of the substrate relative to the alignment device. While the processing system prepares the substrate for processing, by adjusting the orientation and position of the substrate with respect to the alignment device, the processing system can transport a second substrate to a second alignment device.

The device, while novel in and of itself, is utilized in conjunction with the method of using two or more alignment devices in adjacent modules to share process resources, where the process resources are a substrate scribing system.

BRIEF DESCRIPTION OF THE DRAWINGS

The present invention will now be described in greater detail with reference to the embodiments illustrated in the accompanying drawing, in which like elements bear like reference numerals, and wherein:

FIG. 1 is a top view of an aligning system in accordance with the present invention;

FIG. 2 is a top view of the aligning system with two substrates positioned by a robot at respective alignment stations;

FIG. 3 is a side view of the aligning system with three bar code reading systems located above the cassette stations and a scribing system;

FIG. 4 top view of a substrate misaligned with respect to the chuck by a distance A and an angle α; and FIG. 5 perspective view of a process resource.

DETAILED DESCRIPTION OF THE PREFERRED EMBODIMENTS

As shown in the drawings, a substrate alignment system 10 for aligning and processing substrates includes one or more substrate sourcing devices 12, 32, 40, a robotic substrate handler 16 with an end effector 42, a process module 14, and a process resource 24 (FIG. 3). Each substrate sourcing device 12, 32, 40 (e.g., cassette station) contains at least one substrate 18, 38. An example of a substrate 18 having a reference flat 52 or notch on the substrate surface 54 is shown in FIG. 4. After profiling a substrate 18, 38 in the process module 14, the substrate is oriented such that a laser beam 26 can mark a scribing area 74 of the substrate surface 54.

FIGS. 1–4 illustrate one embodiment of a substrate alignment system 10 in accordance with the invention. In the system 10, a robotic substrate handler 16 includes at least two linkages and a distal-most link 60 supports an end effector 42 which contacts the substrates 18, 38. The robotic substrate handler 16 may be driven by a series of belts and pulleys or by any other known drive mechanism. End effector 42 of the robotic substrate handler 16 allows the handler to transport substrates 18, 38 between various regions in the system, such as substrate sourcing devices 12, 32, 40, process module 14, etc.

In operation of this embodiment of the substrate alignment system, the end effector 42 removes a substrate 18 from a sourcing device 12 and moves the substrate to an alignment station 28 in the process module 14. As most clearly shown in FIG. 2, the substrate 18 is placed on a chuck 22 in the alignment station 28 wherein at least a portion of the substrate 18 lies within a processing zone 44. The chuck 22 supports and rotates the substrate 18 about a Z axis, with the substrate maintaining its position on the chuck preferably by suction between the substrate and chuck.

A sensing system 20, such as a lighthouse, mounted by a post 58 above the rotating chuck 22 includes a light source (not shown) which illuminates the substrate edge 56. Light sensors (not shown), such as CCD sensors, positioned on an opposite side of the substrate 18 can detect the light not occluded by the substrate and thereby sense the substrate edge 56 and locate the reference flat or notch 52 as the substrate is rotated. The light sensors produce a signal proportional to the size of the shadow cast by the substrate 18 as the edge 56 crosses the lightbeam produced by the light source.

This profiling step identifies the initial substrate orientation and placement which are subsequently used, during the scribing process, to compensate for any encountered misalignment, as described below. The physical geometry of the substrate 18, including center point, radius, and any abnormalities in the substrate's circumference can then be determined. Specifically, data collection sensors (not shown) transmit the alignment information representing the sensed edge of the substrate 18 to a process resource 24 which, based upon the data, determines the location of the substrate center 46 and whether the substrate center is misaligned relative to a reference point 48 located at the center of the chuck 22. Knowing the location of the reference flat 52, the chuck 22 then rotates the substrate 18 such that a desired scribing area 74 on the substrate lies within the processing zone 44.

The process resource 24 is located above the processing zone 44 and directs a laser beam 26 during a marking or scribing process. The marking process involves directing the laser beam 26 in horizontal and vertical directions across at least a portion of a substrate surface such that the laser beam creates the desired mark(s) on said surface. Generally, the system creates a mark on the substrate surface for the purpose of substrate identification.

As shown in FIG. 5, a laser beam 26 enters the process resource 24 and is expanded by a beam expander 62. An optical system contained in the process resource 24, for example, a system with two mirrors 64, 66 can deflect the laser beam 26 in both the X and Y directions, thereby allowing the system to control the focal plane of the beam without causing the laser head to incur a positional shift. The mirrors 64, 66 may be steered by galvanometers 68, 70 or any other known adjusting mechanism, including but not limited to lead screws and servo motor combinations. The galvanometers 68, 70 can steer the mirrors 64, 66 about 1° to about 30° to deflect the laser beam 26. It will be understood that the optical system may comprise any other suitable means, including but not limited to prisms.

As shown most clearly in FIG. 4, when the substrate center 46 is offset from the center of the chuck 22, a vector V between the substrate center 46 and a reference point 48 having a magnitude of length A and an angle α will represent any misalignment of the substrate 18 with respect to the alignment station 28. In order to properly mark the scribing area 74 of the substrate surface 54 while the substrate is off-center relative to the alignment station 28, the substrate 18 and the laser beam 26 must be adjusted relative to the substrate edge 56 to compensate for the placement error.

In order to address the problem of misalignment of the substrate with respect to the alignment station, the present invention compensates for this placement error by orienting the substrate 18 relative to the processing zone 44, then mathematically translating a coordinate system of the process resource 24. In particular, the alignment station 28 can rotate the substrate 18 to a desired orientation, and the process resource 24 can incorporate the alignment information received from the data collection sensors to mathematically translate its coordinate system by the vector V. Accordingly, the galvanometers 68, 70 will translate the laser beam 26 by the vector V such that the laser beam can mark the desired scribing area 74 on the substrate surface 54 despite the off-centering of the substrate relative to the alignment station 28. Thus, the substrate alignment system 10 can easily and quickly orient and position a misaligned substrate for marking the substrate surface without using the robotic substrate handler 16 to correct the placement error.

After transporting the substrate 18 to the alignment device 28 and while the processing resource 24 processes that first substrate 18, the robotic substrate handler 16 is then free to retrieve a second substrate 38 from a substrate sourcing device 12 and deliver the substrate 38 to the second alignment device 30 within the process module 14 for subsequent processing. As most clearly shown in FIG. 2, the substrate 38 is placed on a chuck 36 in the alignment station 14 wherein at least a portion of the substrate 38 lies within the processing zone 44. The alignment stations 28, 30 are proximally located such that the substrates 18, 38 can extend into the processing zone 44 and share the process resource 24.

While the process resource 24 completes the processing or marking of the first substrate 18 in the processing zone, the alignment station 30 will profile the second substrate 38 delivered to the chuck 36 by the end effector 42 of the robotic substrate handler 16. The alignment station 30 profiles the second substrate 38 as described with respect to the alignment station 28. Before completing the profiling and marking of the first substrate 18 in the processing zone 44, the profiling data collected from the lighthouse 34 concerning the second substrate 38 is passed to the shared process resource 24. After completing the processing of the first substrate 18, the process resource 24 can signal for adjustment of the galvanometers 68, 70 to steer the mirrors 64, 66 and direct the laser beam 26 toward the scribing area 74 on the second substrate 38.

The first substrate 18 in the alignment station 28 is free to be removed after it has been completely processed. The chuck 22 will rotate the substrate 18 to the original position and orientation when first delivered from the substrate sourcing device 12, and the robotic substrate handler 16 can return the substrate to the sourcing device. By following the same path it used to deliver the substrate 18 to the alignment station 28, the robotic substrate handler 16 can avoid bumping or damaging the substrate edge 56 while returning the substrate to the sourcing device 12. The robot 16 will then retrieve a subsequent substrate from the substrate sourcing device 12. Typically, the robotic substrate handler 16 will process the entire substrate set contained with the same substrate sourcing device 12 before taking substrates from a different sourcing device 32, 40 to avoid the possibility of mixing substrate sets.

A user interface (not shown) allows a user to directly access the substrate alignment system 10 and perform maintenance or other functions. The user interface may be positioned remotely or adjacent to the system 10.

The present invention provides advantages of more efficiently using the process resource. Since the alignment stations are located adjacent to each other to receive wafers for processing, the alignment stations can share a processing device. Further, the system is designed such that the second substrate can be prepared for processing without affecting or interfering with a first substrate being processed. With only one process resource required to serve two or more processing modules in close proximity, cost is reduced relative to those system solutions that utilize multiple process stations in order to increase throughput.

While the invention has been described in detail with reference to the embodiments thereof, it will be apparent to one skilled in the art that various changes and modifications can be made and equivalents employed, without departing from the present invention.

What is claimed is:

1. A substrate processing system, comprising:
    a process module having at least two alignment devices in close proximity; and
    a marking device located adjacent to the two alignment devices such that the marking device has a processing zone which overlaps a substrate located at each of the alignment devices.

2. The substrate processing system of claim 1, wherein the marking device can mark a substrate on each of the at least two alignment devices without incurring a positional shift.

3. The substrate processing system of claim 1, further comprising:
    a sensing system for sensing the orientation and position of the substrate in the alignment device.

4. The substrate processing system of claim 3, further comprising:
    means for adjusting each of at least two substrates in the alignment devices, the adjustment in accordance with information provided by said sensing system to achieve alignment between the substrates and the marking device.

5. The substrate processing system of claim 1, wherein the marking device produces a marking beam which can reach any location within the processing zone.

6. The alignment system according to claim 5, wherein the marking device includes at least one mirror for directing the marking beam.

* * * * *